(12) United States Patent
Paik

(10) Patent No.: US 7,098,089 B2
(45) Date of Patent: Aug. 29, 2006

(54) METHOD OF FABRICATING POLY-SILICON THIN FILM TRANSISTOR USING METAL INDUCED LATERAL CRYSTALLIZATION

(76) Inventor: Woon Suh Paik, 577-1 I-dong, Sangnok-gu, Ansan-si, Gyeonggi-do (KR)

( * ) Notice: Subject to any disclaimer, the term of this patent is extended or adjusted under 35 U.S.C. 154(b) by 0 days.

(21) Appl. No.: 11/119,775

(22) Filed: May 3, 2005

(65) Prior Publication Data

US 2005/0250265 A1  Nov. 10, 2005

(30) Foreign Application Priority Data

May 4, 2004   (KR) ........................ 10-2004-0031418

(51) Int. Cl.
*H01L 21/00*   (2006.01)

(52) U.S. Cl. ........................ 438/151; 438/163; 438/166

(58) Field of Classification Search ................. 438/149, 438/151, 163, 166
See application file for complete search history.

(56) References Cited

U.S. PATENT DOCUMENTS 6,586,287 B1 * 7/2003 Joo et al. ................... 438/166

* cited by examiner

*Primary Examiner*—Jack Chen
(74) *Attorney, Agent, or Firm*—Rosenberg, Klein & Lee

(57) ABSTRACT

A method of fabricating a thin film transistor using a metal induced lateral crystallization is provided. The thin film transistor fabrication method includes the steps of: forming an amorphous silicon film on an insulation substrate, and then patterning the amorphous silicon film, to thereby form a semiconductor layer; sequentially forming a gate insulation film and a gate electrode on the substrate, and forming a photosensitive film pattern for forming the gate electrode, and then over-etching the gate electrode by a wet etching process; dry-etching the gate insulation film and then patterning the dry-etched gate insulation film again by the wet etching process; removing the photosensitive film pattern; and ion-injecting high-concentration impurities into the semiconductor layer to thus form a source/drain region and a lightly doped drain (LDD) structure simultaneously. When a thin film transistor is fabricated according to the above-described steps, an off-set and LDD structure essential for the thin film transistor can be effectively formed without requiring for an additional mask process.

7 Claims, 5 Drawing Sheets

METHOD OF FABRICATING POLY-SILICON THIN FILM TRANSISTOR USING METAL INDUCED LATERAL CRYSTALLIZATION

BACKGROUND OF THE INVENTION

1. Field of the Invention

The present invention relates to a method of fabricating a low-temperature poly-silicon thin film transistor using a metal induced lateral crystallization (MILC) technology, and more particularly, to a new method of fabricating a thin film transistor in which an additional mask process and a separate ion injection process are not necessary in order to form an off-set and lightly doped drain (LDD) structure.

2. Description of the Related Art

In general, a thin film transistor which is used in a display device such as a liquid crystal display (LCD) or an organic light emitting diode (OLED) is fabricated by the processes of depositing amorphous silicon on a transparent substrate such as glass or quartz, forming a gate insulator and a gate electrode, injecting a dopant into a source and drain, and then annealing the dopant-injected source and drain so as to be activated to then form an insulation layer.

By the way, as a display device using a thin film transistor requires for a fast operating speed and becomes compact in size, a degree of integration of a driving integrated circuit (IC) becomes large and an aperture ratio of a pixel region becomes reduced. Accordingly, an electron mobility on a silicon film should be heightened so that a driving circuit is formed on a pixel thin film transistor (TFT) and a glass substrate simultaneously, and an aperture ratio of each pixel should be heightened.

For this purpose, an amorphous silicon film is crystallized by metal induced lateral crystallization (MILC) to thus form a poly-crystallization thin film transistor. Accordingly, in addition to the need to heighten the electron mobility and the pixel aperture ratio, a driving circuit is formed simultaneously together with a pixel thin film transistor (TFT), to thereby provide a merit of reducing a production cost. In addition to the MILC, a solid phase crystallization (SPC) method by high-temperature heat treatment and an eximer laser annealing (ELA) method by laser crystallization are known as the amorphous silicon film crystallization method.

Meanwhile, since a leakage current is large in the case of a poly-crystallization thin film transistor differently from an amorphous thin film transistor, a lightly doped drain (LDD) structure has been known as being essential in order to suppress the leakage current (see IEEE Trans. Electron Devices, Vol. 40, No. 5, p. 938, 1993).

In particular, it is reported that leakage current is caused by metal pollution at a boundary portion between a source/drain and a channel, in the case of a MILC poly-crystallization thin film transistor (see IEEE Trans. Electron Devices, Vol. 32, p. 258, 1998).

Also, in the case that a thin film transistor is generally fabricated using MILC, a boundary plane between MILC and MIC (Metal Induced Crystallization) is positioned in a channel region. As a result, a trap phenomenon occurs at the channel region through the boundary plane, to thereby influence upon features of the thin film transistor device. Thus, in order to avoid the trap phenomenon, it is necessary to form an off-set region between a metal film for MILC and a gate insulation film.

A conventional method of fabricating a thin film transistor using a MILC method will follow.

FIGS. 1A through 1D are cross-sectional views for explaining a conventional low-temperature poly-silicon thin film transistor fabrication method using a MILC method, respectively.

Referring to FIG. 1A, a buffer layer 10 made of an oxide film is formed on an insulation substrate such as a glass substrate (not shown), and then an amorphous silicon film is formed on the buffer layer 10. An active layer pattern 11 is formed by photographically etching the amorphous silicon film. Subsequently, an insulation film and a metal film are deposited on the active pattern 11, and then patterned by a photographic etching process, to thereby form a gate electrode 13 and a gate insulation film 12.

Then, referring to FIG. 1B, a lightly doped drain (LDD) region 17 is formed through low-concentration ion injection. Then, as shown in FIG. 1C, a spacer 14 is formed at both sides of the gate electrode 13 and the gate insulation film 12 using a photosensitive agent, to thereby form an off-set structure. Then, a nickel (Ni) film 15 is deposited on the entire surface as crystallization expediting metal, and then a source 11S and a drain 11D are formed through high-concentration ion injection.

Referring to FIG. 1D, the photosensitive film 14 is removed by using a lift-off method, and then a MILC heat treatment is performed between 400° C. through 600° C. which is not more than a glass modification temperature of glass used as a substrate, to thereby crystallize a channel portion 16.

As described above, in the case of a conventional thin film transistor fabrication method using the MILC method, separate photographic etching processes are necessary to form an off-set structure and a LDD structure. Thus, these separate photographic etching processes cause productivity to be lowered and production cost to increase. Also, in order to form a LDD region at a junction portion between a channel and a source/drain, a separate ion injection process differing from the ion injection concentration injected into the source/drain region becomes necessary.

Thus, in order to form a LDD region, an additional ion injection process and a spacer forming process are necessary as described above, which also causes productivity to be lowered and production cost to increase.

SUMMARY OF THE INVENTION

To solve the above problems, it is an object of the present invention to provide a method of fabricating a poly-silicon thin film transistor which can form an off-set and LDD structure simultaneously without having an additional mask process or a separate ion injection process.

To accomplish the above object of the present invention, according to an aspect of the present invention, there is provided a method of fabricating a thin film transistor using a metal induced lateral crystallization (MILC), the thin film transistor fabrication method comprising the steps of: forming an amorphous silicon film on an insulation substrate; patterning the amorphous silicon film, to thereby form a semiconductor layer; sequentially forming a gate insulation film and a gate electrode material on the substrate including the semiconductor layer; forming a photosensitive film pattern for forming the gate electrode on the upper surface of the gate electrode material, and then over-patterning the gate electrode material by a wet etching process to thereby form a gate electrode; primarily etching the gate insulation film by a dry etching process by using the photosensitive film pattern as an etching mask, and then patterning the dry-etched gate insulation film in the same width as that of the photosensitive film; secondarily etching the primarily etched gate insulation film by the wet etching process, to thereby pattern the secondarily etched gate insulation film in a manner that the width of the at least gate insulation film is larger than that of the gate electrode and smaller than that of the photosensitive film pattern; forming a metal film for MILC crystallization on the entire surface of the substrate; removing the photosensitive film pattern; and ion-injecting high-concentration impurities into the semiconductor layer to thus form a high-concentration source/drain region and a low-concentration lightly doped drain (LDD) structure in the lower side of the gate insulation film which is exposed out of the gate electrode.

Here, the dry etching method is performed by plasma etching or reactive ion etching (RIE).

Also, the width of the gate insulation film is patterned to be smaller than that of the photosensitive film pattern. As a result, the off-set structure is formed. The off-set structure distance is set to be 500 Å~25,000 Å, preferably 2,500 Å~10,000 Å, inwards from the outer circumferential portion of the photosensitive film pattern.

The LDD region is defined as a gate insulation film portion which is exposed outside of the gate electrode. The LDD region distance is set to be 500 Å~25,000 Å, preferably 2,500 Å~10,000 Å.

The thin film transistor fabrication method further comprises the step of heat-treating the substrate at a temperature of 400 through 600° C. after the ion injection of impurities, to thereby crystallize a semiconductor layer made of an amorphous silicon film into a poly-silicon film.

Also, the metal film is made of any one selected from the group consisting of Ni, Pd, Ti, Ag, Au, Al, Sn, Sb, Cu, Co, Cr, Mo, Tr, Ru, Rh, Cd, and Pt.

In the present invention, when a metal film is formed on the entire surface of the substrate after the gate electrode and the gate insulation film have been patterned, an off-set structure can be formed without having an additional mask process due to a remaining photosensitive film pattern for forming a gate electrode.

Also, when the gate insulation film has been dry-etched and then etched again by a wet etching process in the present invention, some thin film gate insulation films are left in the outer side of the gate electrode. Accordingly, when a source/drain region is formed by ion-injecting high-concentration impurities, an ion injection amount of ions injected into the source/drain region is partly restricted due to some remaining gate insulation film. Accordingly, the LDD structure can be formed without having an additional mask process and an additional ion injection process.

Thus, the present invention can form a LDD, a source region, and a drain region simultaneously, when ion injection of high-concentration impurities is performed after the photosensitive film pattern has been removed. Accordingly, the LDD structure, and the source region and the drain region can be formed simultaneously by one-time ion injection.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

A preferred embodiment of the present invention will be described with reference to the accompanying drawings.

Referring to FIGS. 2A through 2G, a method of fabricating a thin film transistor using a MILC method according to an embodiment of the present invention will be described below.

Figure 1A:
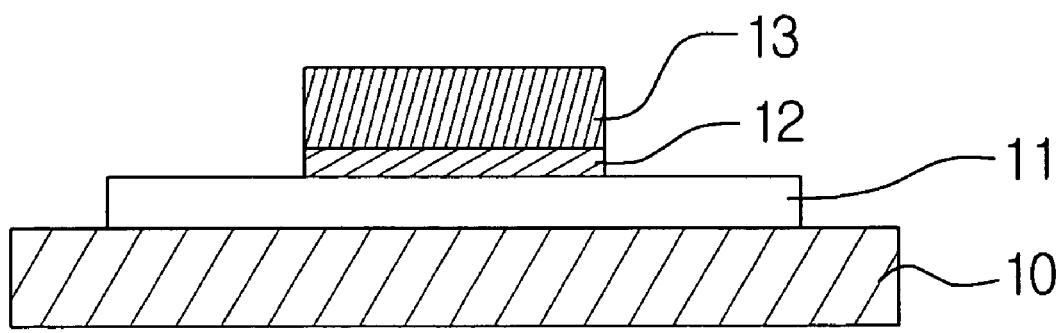
FIGS. 1A through 1D are cross-sectional views for explaining a method of fabricating a low-temperature polysilicon thin film transistor using a conventional MILC method.
Figure 1B:
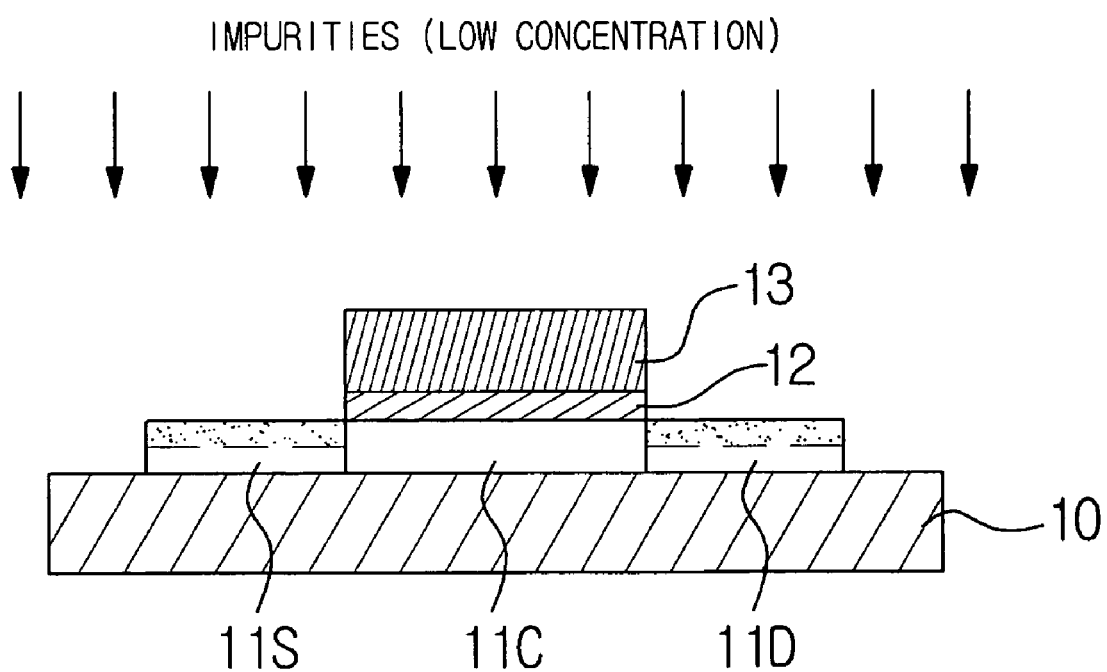
Figure 1C:
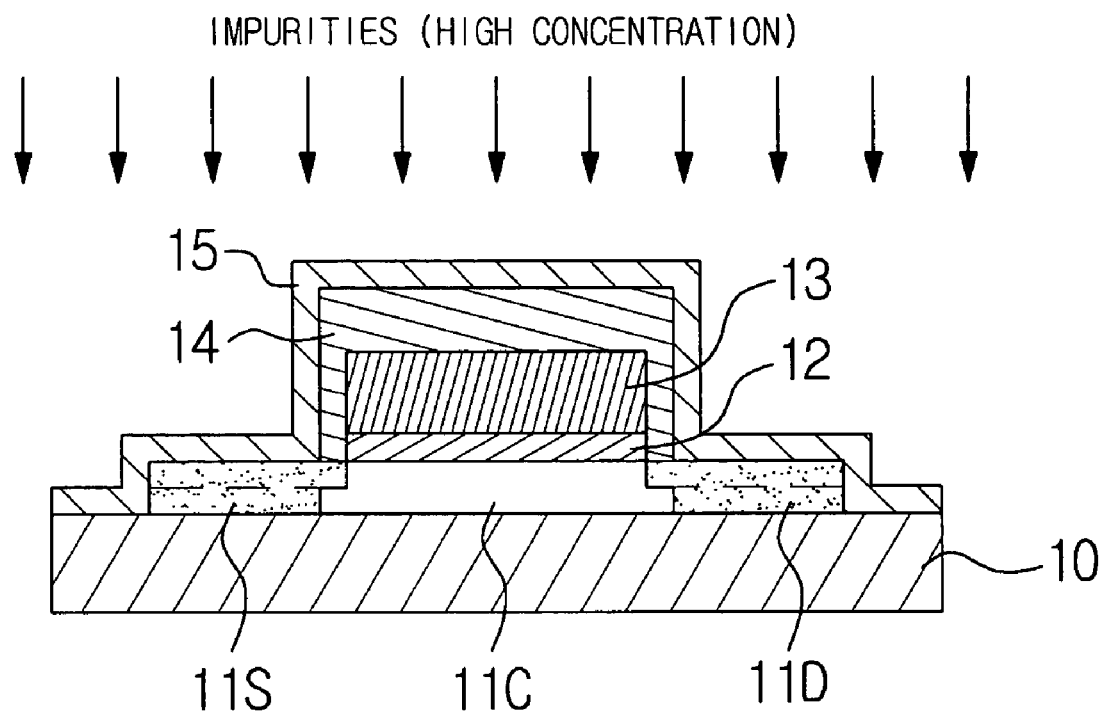
Figure 1D:
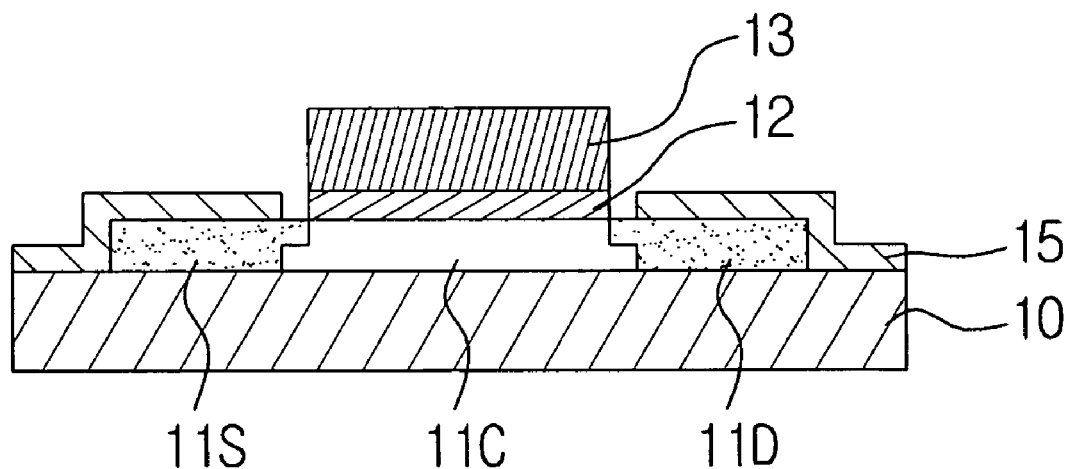
Figure 2A:
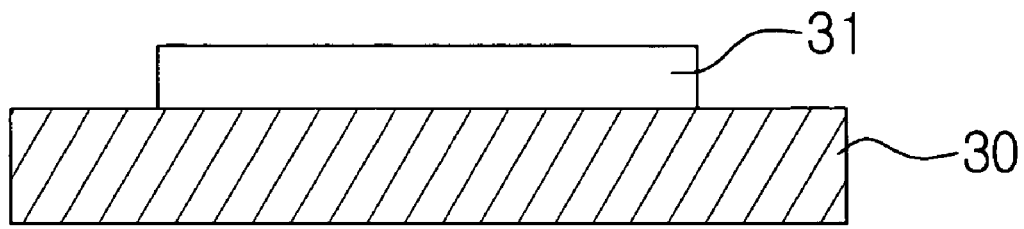
FIGS. 2A through 2G are cross-sectional views for explaining a method of fabricating a thin film transistor using a MILC method according to an embodiment of the present invention.

First, referring to FIG. 2A, a buffer layer (not shown) made of an oxide film is formed on an insulation substrate 30 such as a glass substrate. Then, an amorphous silicon film is deposited on the insulation substrate 30, and the amorphous silicon film is patterned using a mask (not shown) for forming a semiconductor layer, to thereby form a semiconductor layer 31 made of an amorphous silicon film.

Figure 2B:
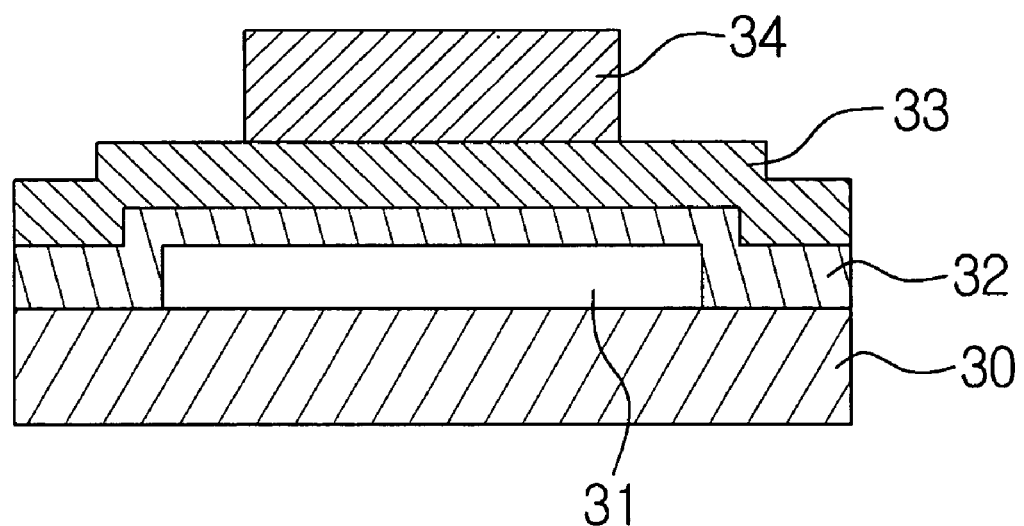

Then, as shown in FIG. 2B, a gate insulation film 32 and a gate electrode material 33 are sequentially formed on the insulation substrate 30 including the semiconductor layer 31, for example, by a PECVD (Plasma Enhanced Chemical Vapor Deposition) method. Then, a photosensitive film pattern 34 is formed in order to pattern the gate insulation film 32 and the gate electrode material 33.

Figure 2C:
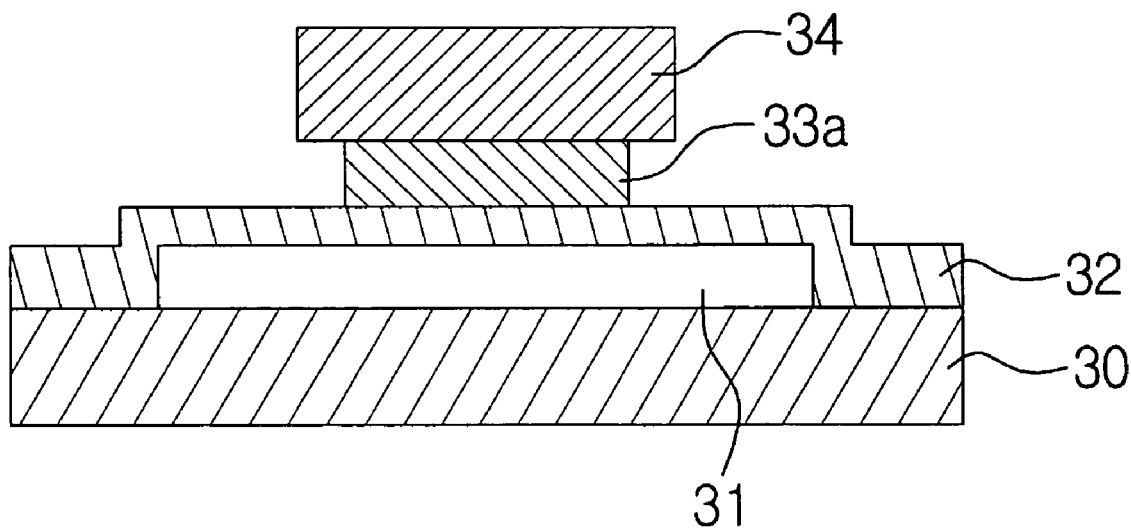

Then, as shown in FIG. 2C, the gate electrode material 33 is etched using a wet etching method in which the formed photosensitive film pattern 34 is used as an etching mask. Here, the gate electrode material 33 is over-etched so as to be patterned inwards by a predetermined length in comparison with the length of the formed photosensitive film pattern 34, to thereby form a gate electrode 33a.

Figure 2D:
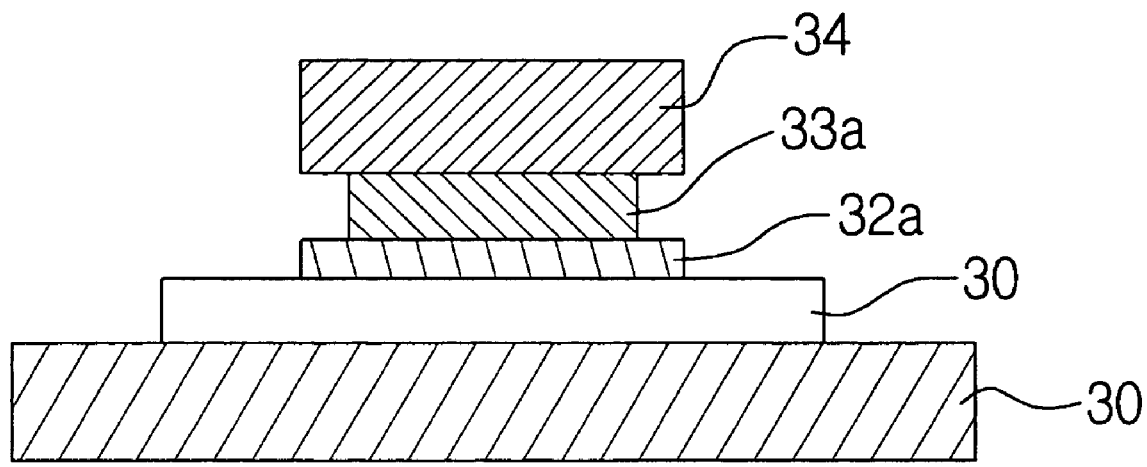

Thereafter, as shown in FIG. 2D, the gate insulation film 32 is primarily patterned using a dry etching method, in which the photosensitive film pattern 34 is used as an etching mask. In this case, applicable dry etching methods are a plasma etching method and a reactive ion etching (RIE) method. Since the dry etching has a non-isotropic property, the gate insulation film 32 is reduced into the same width as that of the photosensitive film pattern 34 in the case that the dry etching is applied.

Figure 2E:
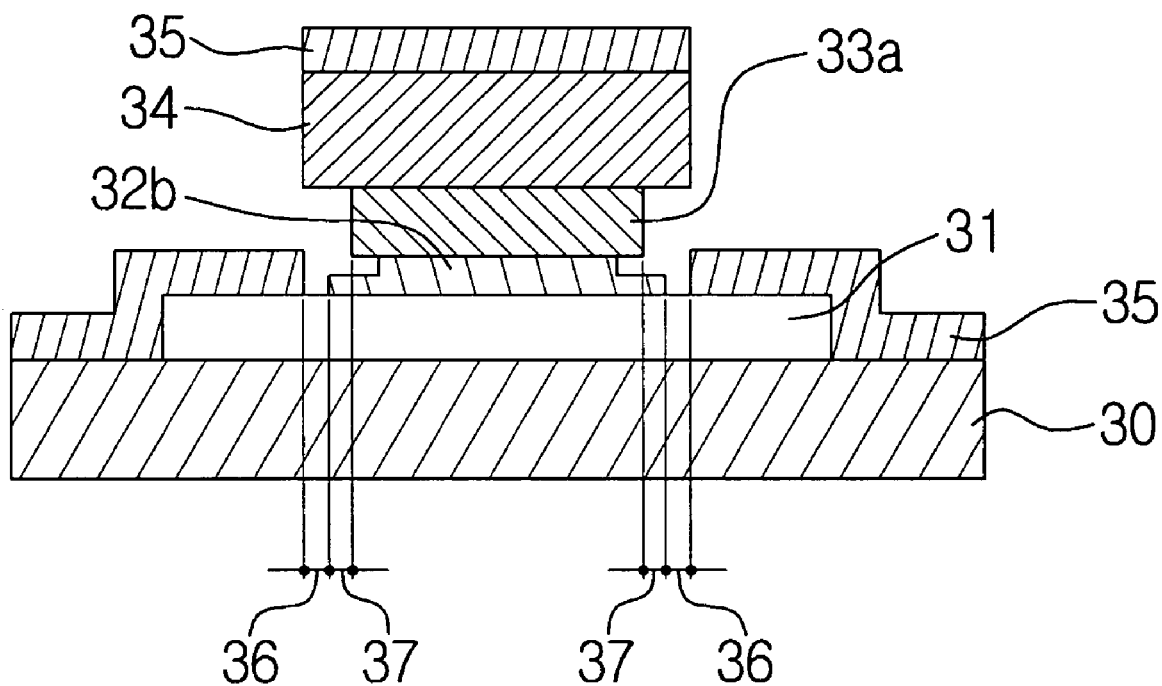

Referring to FIG. 2E, the primarily etched gate insulation film 32a is secondarily etched by a wet etching method. Here, since the wet etching has an isotropic property, the pattern of the secondarily etched gate insulation film 32b which is etched by a substantially same thickness in the vertical and horizontal directions from an exposed surface can be obtained as shown in FIG. 2E.

The secondary etching with respect to the gate insulation film 32a is executed in a manner that at least the width of the etched gate insulation film 32b is smaller than that of the photosensitive film pattern 34 but larger than that of the gate electrode 33a, and the thickness of the exposed gate insulation film becomes thinner in comparison with the thickness thereof before etching.

As a result, the over-etching of the photosensitive film pattern 34 and the gate electrode material and the secondary etching of the gate insulation film are properly combined with each other, to thereby form an off-set region 36 without having an additional process.

As a specific secondary etching condition with respect to the gate insulation film 32a, an off-set distance 36 is secured to be 500 Å~25,000 Å, preferably 2,500 Å~10,000 Å, inwards from the outer circumferential portion of the photosensitive film pattern 34 which is used as an etching mask. Also, a length 37 of a gate insulation film 32b which is exposed from the outer circumference of the patterned gate electrode 33a, that is, an LDD distance is secured to be 500 Å~25,000 Å, preferably 2,500 Å~10,000 Å.

Thereafter, a crystallization expediting metal film 35 is deposited with a thickness of 1~10,000 Å, preferably, 10~200 Å, on the insulation substrate 30 including the semiconductor layer 31, by any one of sputtering, evaporation by heating, PECVD, and a solution coating. Here, as the applicable material of the metal film 35 is any one selected from the group consisting of Ni, Pd, Ti, Ag, Au, Al, Sn, Sb, Cu, Co, Cr, Mo, Tr, Ru, Rh, Cd, and Pt.

In the case that the metal film 35 is deposited while maintaining the photosensitive film pattern 34 as described above, the metal film 35 is distant by the off-set distance 36 from the outer circumference of the gate insulation film 32b, and formed on a source/drain forming region of the semiconductor layer 31.

Figure 2F:
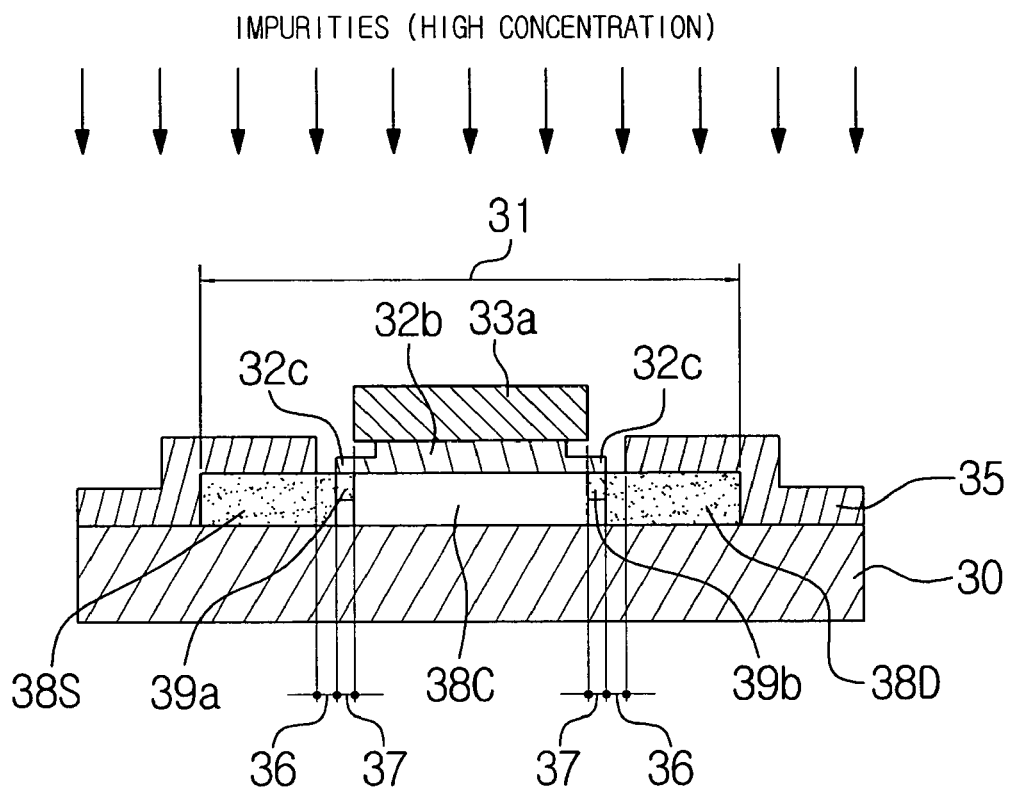

Then, as shown in FIG. 2F, the photosensitive film pattern 34 is removed from the insulation substrate 30 by a lift-off method, and high-concentration impurities are ion-injected over the entire surface, to thereby form a source region 38S and a drain region 38D being high-concentration impurity regions. Also, at the time of ion-injecting the high-concentration impurities, ion-injection of impurities via an exposed region of the gate insulation film 32b produced by the dry and wet etching methods in which the thickness of the gate insulation film 32b is thin, is limited in comparison with the case of ion-injection of impurities via the other portions. Accordingly, LDD regions 39a and 39b are also simultaneously formed below the exposed region 32c.

Figure 2G:
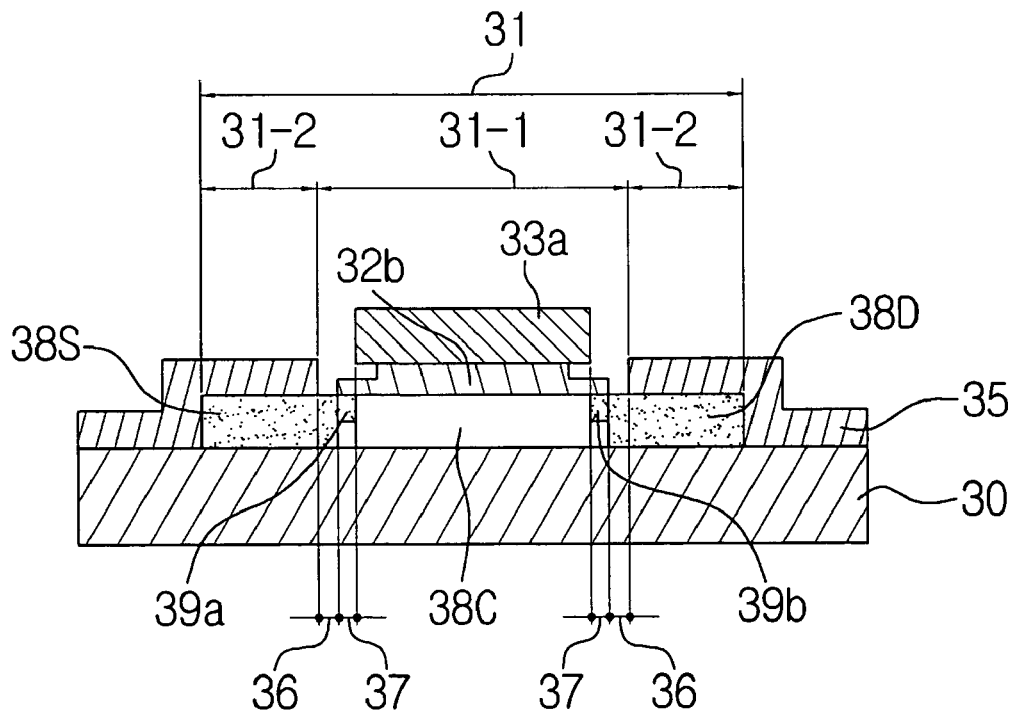

Referring to FIG. 2G, the substrate is heat-treated at a temperature of 400 through 600° C. after the ion injection of impurities, to thereby execute a crystallization process. Accordingly, the semiconductor layer 31 made of an amorphous silicon film is crystallized into a poly-silicon film. Here, a portion 31-2 contacting the metal film 35 among the semiconductor layer 31 made of the amorphous silicon film is crystallized by a MIC (Metal Induced Crystallization) method and is crystallized into a poly-silicon film. Meanwhile, an amorphous silicon film portion 32-1 which does not contact the metal film 35, that is, an exposed portion and a channel region 38C located below the gate electrode 33a are crystallized by a MILC method and crystallized into a poly-silicon film.

As described above, a thin film transistor fabrication method according to an embodiment of the present invention does not require an additional mask process and a separate ion injection process in order to form an off-set structure and a lightly doped drain (LDD) structure, to thereby simplify a process, enhance productivity and reduce a production cost.

As described above, in the case of a thin film transistor fabrication method using MILC according to the present invention, a boundary plane between MILC and MIC is not placed in a channel region due to formation of an off-set region. Therefore, a trap phenomenon in the channel region is prevented to thereby enhance features of thin film transistors produced by the thin film transistor fabrication method. Also, since an additional mask process is not necessary in order to form an off-set region, a process is simplified, a production cost is lowered and productivity is enhanced.

Also, according to the thin film transistor fabrication method using a MILC method, a LDD region is also simultaneously formed only by one-time ion-injection. Accordingly, an additional process is not necessary to form a separate LDD region.

As described above, the preferable embodiment of the present invention has been described with reference to the accompanying drawings. However, the present invention is not limited to the above-described embodiment. It is apparent to one who has an ordinary skill in the art that there may be many modifications and variations within the same technical spirit of the invention.

What is claimed is:

1. A method of fabricating a thin film transistor using a metal induced lateral crystallization (MILC), the thin film transistor fabrication method comprising the steps of:

forming an amorphous silicon film on an insulation substrate;

patterning the amorphous silicon film, to thereby form a semiconductor layer;

sequentially forming a gate insulation film and a gate electrode material on the substrate including the semiconductor layer;

forming a photosensitive film pattern for forming a gate electrode on the upper surface of the gate electrode material, and then over-patterning the gate electrode material by a wet etching process to thereby form the gate electrode;

primarily etching the gate insulation film by a dry etching process by using the photosensitive film pattern as an etching mask, and then patterning the dry-etched gate insulation film in the same width as that of the photosensitive film pattern;

secondarily etching the primarily etched gate insulation film by the wet etching process, to thereby pattern the secondarily etched gate insulation film in a manner that the width of the at least gate insulation film is larger than that of the gate electrode and smaller than that of the photosensitive film pattern;

forming a metal film for MILC crystallization on the entire surface of the substrate;

removing the photosensitive film pattern; and ion-injecting high-concentration impurities into the semiconductor layer to thus form a high-concentration source/drain region and a low-concentration lightly doped drain (LDD) structure in the lower side of the gate insulation film which is exposed out of the gate electrode.

2. The thin film transistor fabrication method according to claim 1, wherein the dry etching method is performed by plasma etching or reactive ion etching (RIE).

3. The thin film transistor fabrication method according to claim 1, wherein the width of the gate insulation film is patterned to be smaller than that of the photosensitive film pattern, to accordingly form the off-set structure, and wherein the off-set structure distance is set to be 500 Å~25,000 Å, inwards from the outer circumferential portion of the photosensitive film pattern.

4. The thin film transistor fabrication method according to claim 1, wherein the metal film is deposited at a state where the photosensitive film pattern is maintained, and then is formed on a source/drain forming region in the semiconductor layer at a distance by the off-set distance from the outer circumference of the gate insulation film.

5. The thin film transistor fabrication method according to claim 1, wherein the LDD region is defined as a gate insulation film portion which is exposed outside of the gate electrode, and wherein the LDD region distance is set to be 500 Å~25,000 Å.

6. The thin film transistor fabrication method according to claim 1, further comprising the step of heat-treating the substrate at a temperature of 400 through 600° C., to thereby crystallize a semiconductor layer made of an amorphous silicon film into a poly-silicon film.

7. The thin film transistor fabrication method according to claim 1, wherein the metal film is made of any one selected from the group consisting of Ni, Pd, Ti, Ag, Au, Al, Sn, Sb, Cu, Co, Cr, Mo, Tr, Ru, Rh, Cd, and Pt.

* * * * *